United States Patent [19]

Senger

[11] 4,065,726
[45] Dec. 27, 1977

[54] NEGATIVE FEEDBACK AMPLIFIER AND LEVER SHIFTER

[75] Inventor: Stephen J. Senger, Jamestown, N. Dak.

[73] Assignee: The United States of America as represented by the Secretary of the Navy, Washington, D.C.

[21] Appl. No.: 713,455

[22] Filed: Aug. 11, 1976

[51] Int. Cl.² ............................................. H03F 3/04
[52] U.S. Cl. .................................... 330/288; 330/75; 330/293; 330/296
[58] Field of Search ................... 330/30 D, 69, 35, 75, 330/86, 145, 22

[56] References Cited

U.S. PATENT DOCUMENTS 3,588,530  6/1971  Langan ........................... 330/30 DX Primary Examiner—Lawrence J. Dahl
Attorney, Agent, or Firm—Richard S. Sciascia; Joseph M. St.Amand; William W. Cochran, II

[57] ABSTRACT

A direct coupled linear amplifier which employs negative feedback to provide accurate and stable gain to AC as well as DC input signals. It also performs the function of a DC level shifter and can therefore be interfaced with a variety of signal sources. A constant current source added to the summing junction of the negative feedback amplifier enables the adjustment of the DC level of the output and the AC gain of the amplifier, completely independently of one another.

5 Claims, 2 Drawing Figures

NEGATIVE FEEDBACK AMPLIFIER AND LEVER SHIFTER

BACKGROUND OF THE INVENTION

The present invention pertains generally to amplifiers and more specifically to negative feedback amplifiers. In conventional negative feedback amplifiers, it is not possible to adjust the AC wide band gain of the amplifier without also shifting the DC level of the output. This limits the ability of the circuit to be interfaced directly with other signal sources such as direct coupling to a signal source that may have a DC offset. Furthermore, the selection of gain resistors in conventional negative feedback amplifiers is limited by the particular supply voltage available in the circuit for each amplifier. For these reasons, it would be desirable to have the ability to vary the AC gain and DC output level independently of one another in a feedback amplifier.

SUMMARY OF THE INVENTION

The present invention overcomes the disadvantages and limitations of the prior art by providing a negative feedback amplifier and level shifter. The circuit comprises a direct coupled linear amplifier which employs negative feedback to provide accurate and stable gain to the AC as well as DC input signals. In addition, it acts as a DC level shifter in a manner which allows the AC gain and DC output level to be adjusted completely independently of one another.

It is therefore an object of the present invention to provide an improved negative feedback amplifier and level shifter.

It is also an object of the present invention to provide a negative feedback amplifier and level shifter which can be direct coupled to a signal source that has an DC offset.

Another object of the present invention is to provide a negative feedback amplifier and level shifter in which gain resistors can be selected independently of supply voltages available in the circuit.

Another object of the present invention is to provide a negative feedback amplifier and level shifter in which the AC gain and DC level output can be adjusted independently of one another.

Other objects and further scope of applicability of the present invention will become apparent from the detailed description given hereinafter. The detailed description indicating the preferred embodiment of the invention is given only by way of illustration since various changes and modifications within the spirit and scope of the invention will become apparent to those skilled in the art from the detailed description. The foregoing abstract of the disclosure is for the purpose of providing a non-legal brief statement to serve as a searching and scanning tool for scientists, engineers and researchers and is not intended to limit the scope of the invention as disclosed herein nor is it intended to be used in interpreting or in any way limiting the scope or fair meaning of the appended claims.

DETAILED DESCRIPTION OF THE PREFERRED EMBODIMENT

Figure 1:
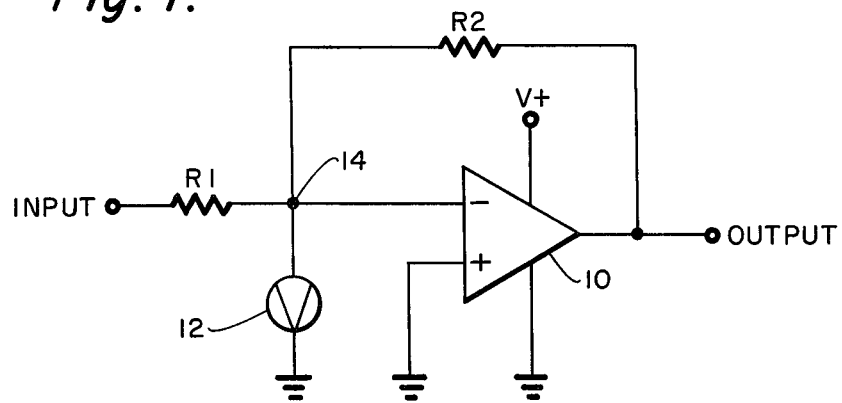
FIG. 1 is an illustrative schematic diagram of the preferred embodiment of the invention.

FIG. 1 illustrates the basic concept of the amplifier of the preferred embodiment of the invention. It consists of a DC amplifier 10 connected in a standard negative feedback mode with the addition of a current source 12. The amplifier 10 can constitute any DC amplifier such as a transistor, tube or integrated circuit type.

In operation, the current source draws a constant amount of current from the summing junction 14 of the amplifier to control the DC level of the output voltage. Since the DC output voltage level is determined by the current at the summing junction, use of a current source at that point provides adjustment of the DC voltage level alone. Of course, the ratio of the feedback resistor $R_2$ to the input resistor $R_1$ alone determines the AC gain of the circuit. Therefore, the AC gain and DC voltage level shift can be controlled completely independently of one another by adjusting the $R_2$, $R_1$ ratio and the current drawn by current source 12, respectively. This enables linear amplification of positive or negative input signals using only a single power supply.

Figure 2:
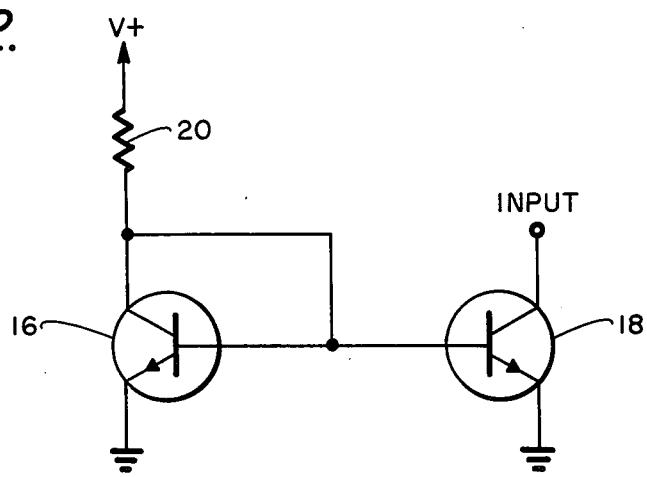
FIG. 2 is a schematic diagram of the current source which is used with the preferred embodiment of the invention.

FIG. 2 is a schematic diagram of the constant current source of the preferred embodiment of the invention. The emitter current of transistor 16 is set by the voltage source V+ and resistor 20. Since transistors 16 and 18 are a matched pair and act as a monolithic device, the same amount of current which flows through transistor 16 will also be drawn through transistor 18. The device of FIG. 2 therefore behaves as a very high output impedance, constant current source and functions to "sink" a predetermined amount of current through its input determined by voltage source V+ and resistor 20. This amount of current is drawn through the input regardless of the voltage present at that point.

The device of the preferred embodiment of the invention therefore offers a unique way of overcoming the limitations of the basic negative feedback amplifier. A constant current source added to the summing junction of the negative feedback amplifier has the effect of enabling the adjustment of the DC level of the output and the AC amplification, independently of one another. The device allows for direct coupling to a signal source that may have a DC offset, such as a transistor amplifier stage, and the ability to shift the output to any desired level without affecting the AC gain of the amplifier. In addition, the amplifier is simple in operation and inexpensive in implementation and provides great cost savings in circuit design.

Obviously many modifications and variations of the present invention are possible in light of the above teachings. For example, any number of different types of DC amplifiers may be used such as operation amplifiers or standard transistor amplifiers. Similarly, any type of current source suitable for its purpose could be used in the circuit. The simplest form of current source is a fairly large resistance in series with a voltage source. This or any of the more sophisticated current sources may be used as long as the circuitry draws a relatively constant current from the summing junction of th negative feedback amplifier. It is therefore to be understood that within the scope of the appended claims, the invention may be practiced otherwise than as specifically disclosed herein.

What is claimed is:

1. A negative feedback amplifier and level shifter comprising:
   a. a DC amplifier having an output, a negative input and a positive input;
   b. a feedback resistance connected between said output and said negative input at said DC amplifier;
   c. an input resistance connected between a signal input and said negative input of said DC amplifier to form a summing junction at said negative input of said DC amplifier;
   d. a matched pair of transistors configured to form a current source connected to draw a predetermined amount of current from said summing junction thereby controlling DC voltage levels at said output of said DC amplifier independently of AC gain of said DC amplifier.

2. The negative feedback amplifier and level shifter of claim 1 wherein said AC gain of said negative feedback amplifier and level shifter is controlled by the ratio of said input resistance to said feedback resistance.

3. The negative feedback amplifier and level shifter of claim 1 wherein said positive input is grounded.

4. The negative feedback amplifier and level shifter of claim 1 wherein said DC amplifier comprises an operational amplifier.

5. A linear amplifier for providing independent adjustment of AC and DC output voltage signals comprising:
   a. an operational amplifier connected in standard negative feedback mode whereby a feedback resistance and an input resistance are connected to form a summing junction at an input to said operational amplifier;
   b. a matched pair of transistors configured to form a current source connected between said summing junction and ground for drawing a predetermined amount of current from said summing junction to control said DC output voltage independently of said AC output voltage, said AC output voltage being proportional to the ratio of said input resistance to said output resistance.

* * * * *